United States Patent
Kim et al.

(10) Patent No.: US 9,842,535 B2
(45) Date of Patent: Dec. 12, 2017

(54) DISPLAY APPARATUS

(71) Applicant: Samsung Display Co., Ltd., Yongin-si, Gyeonggi-Do (KR)

(72) Inventors: Minki Kim, Hwaseong-si (KR); HwanJin Kim, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 54 days.

(21) Appl. No.: 14/864,048

(22) Filed: Sep. 24, 2015

(65) Prior Publication Data
US 2016/0183415 A1 Jun. 23, 2016

(30) Foreign Application Priority Data
Dec. 22, 2014 (KR) .................. 10-2014-0186144

(51) Int. Cl.
*G09G 3/3208* (2016.01)
*H05K 1/02* (2006.01)
*G02F 1/1333* (2006.01)

(52) U.S. Cl.
CPC ..... *G09G 3/3208* (2013.01); *G02F 1/133385* (2013.01); *H05K 1/0209* (2013.01); *G09G 2300/0426* (2013.01); *G09G 2330/045* (2013.01); *H05K 2201/066* (2013.01); *H05K 2201/1056* (2013.01); *H05K 2201/10128* (2013.01)

(58) Field of Classification Search
CPC ....... G02F 1/00; G09G 3/3208; H05K 1/0209
See application file for complete search history.

(56) References Cited

U.S. PATENT DOCUMENTS

| | | | |
|---|---|---|---|
| 9,535,208 B2* | 1/2017 | Kim | G02B 6/0088 |
| 2006/0275965 A1* | 12/2006 | Jeong | H05K 7/20963 438/166 |
| 2007/0291444 A1* | 12/2007 | Kim | H05K 5/02 361/679.01 |
| 2008/0106199 A1* | 5/2008 | Kim | H05K 5/02 313/582 |
| 2008/0107887 A1* | 5/2008 | Kim | C09J 7/0296 428/304.4 |
| 2009/0291609 A1* | 11/2009 | Kim | H05K 7/20427 445/24 |
| 2013/0094246 A1* | 4/2013 | Kim | G09F 9/35 362/613 |
| 2015/0167952 A1* | 6/2015 | Lee | F21V 29/70 362/612 |

(Continued)

FOREIGN PATENT DOCUMENTS

| | | |
|---|---|---|
| KR | 1020050068191 A | 7/2005 |
| KR | 1020060093535 A | 8/2006 |

(Continued)

*Primary Examiner* — Ricardo L Osorio
(74) *Attorney, Agent, or Firm* — H.C. Park & Associates, PLC

(57) ABSTRACT

A display apparatus includes a display panel including a display area and a non-display area, a driving chip disposed in the non-display area, and a heat radiate sheet. The heat radiate sheet includes a first portion disposed on a rear surface of the display panel, a second portion disposed on the driving chip, and a connection portion connecting the first portion and the second portion.

18 Claims, 8 Drawing Sheets

(56) References Cited

U.S. PATENT DOCUMENTS

| | | | | |
|---|---|---|---|---|
| 2015/0173176 A1* | 6/2015 | Lee | ...................... | H05K 1/0259 |
| | | | | 361/749 |
| 2015/0192731 A1* | 7/2015 | Kim | ..................... | G02B 6/0011 |
| | | | | 362/628 |
| 2015/0370133 A1* | 12/2015 | Kim | .................. | G02F 1/133608 |
| | | | | 362/97.1 |

FOREIGN PATENT DOCUMENTS

| KR | 1020080074459 A | 8/2008 |
|---|---|---|
| KR | 1020120136270 A | 12/2012 |

\* cited by examiner

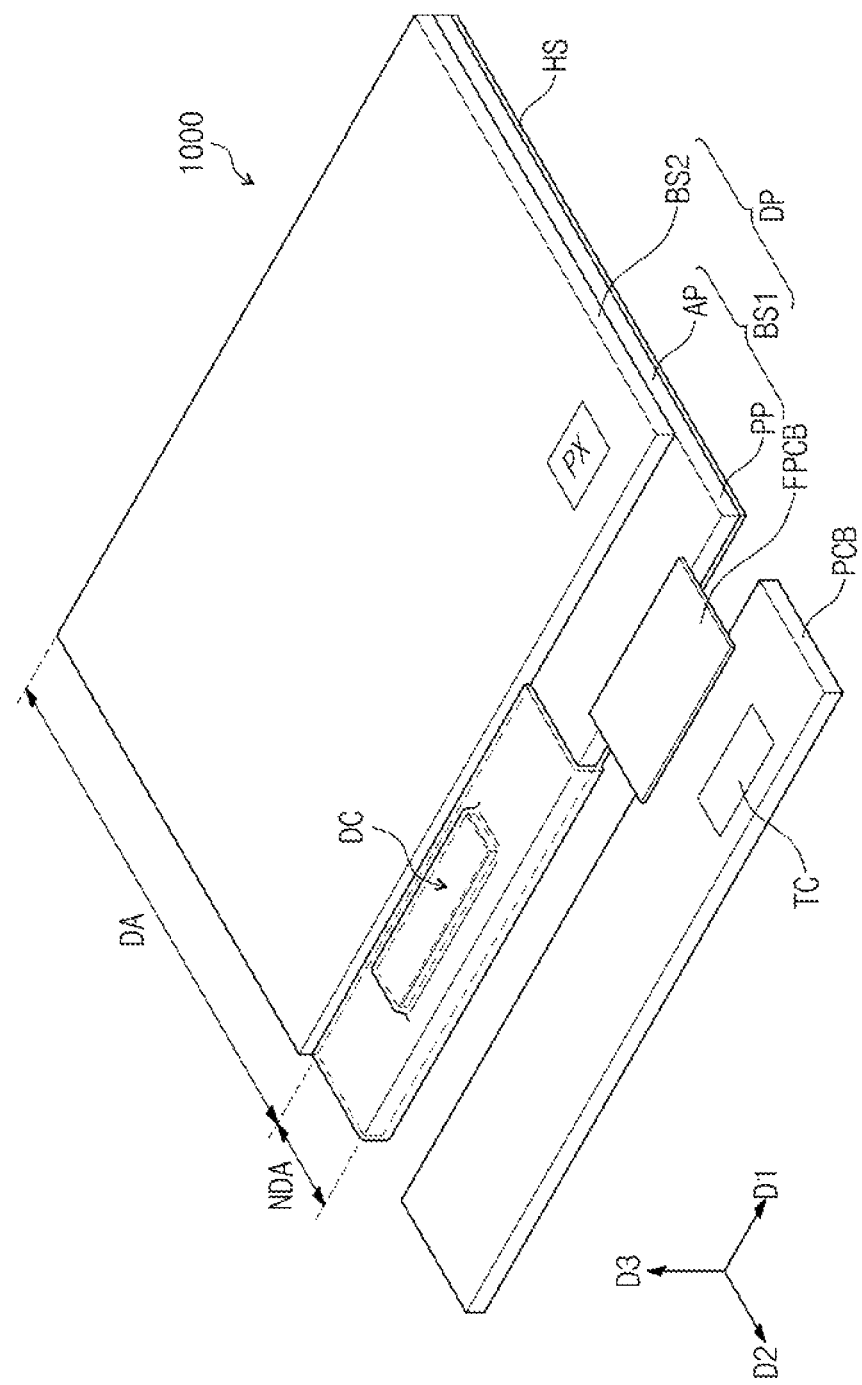

DISPLAY APPARATUS

CLAIM PRIORITY

This U.S. non-provisional patent application claims priority under 35 U.S.C. §119 of Korean Patent Application No. 10-2014-0186144 filed on Dec. 22, 2014, the contents of which are hereby incorporated by reference in its entirety.

BACKGROUND

1. Field of Disclosure

The present disclosure relates to a display apparatus having improved heat radiation efficiency.

2. Description of the Related Art

In recent years, various display apparatuses, such as a liquid crystal display, an organic light emitting display device, an electrowetting display device, a plasma display panel, an electrophoretic display device, etc., have been developed.

Each display apparatus includes pixels generating an image, drivers driving the pixels, and a timing controller controlling the drivers. The display apparatus includes signal lines to electrically connect the drivers and the timing controller. The timing controller applies control signals to the drivers through the signal lines.

The above information disclosed in this Related Art section is only for enhancement of understanding of the background of the invention and therefore it may contain information that does not form the prior art that is already known to a person of ordinary skill in the art.

SUMMARY

The present disclosure provides a display apparatus having improved heat radiation efficiency.

Embodiments of the inventive concept provide a display apparatus including a display panel including a display area configured to display an image and a non-display area except for the display area, a driving chip disposed in the non-display area to drive the display panel, and a heat radiation sheet including a first portion covering a rear surface of the display panel, a second portion covering the driving chip, and a connection portion connecting the first and second portions. The heat radiation sheet includes at least one of copper, graphite, and aluminum.

The display apparatus further includes a printed circuit board facing the display panel such that the first portion is disposed between the printed circuit board and the display panel and a flexible printed circuit board disposed at one side of the display panel to electrically connect the display panel and the printed circuit board. One end of the flexible printed circuit board makes contact with the non-display area and the other end of the flexible printed circuit board makes contact with an upper surface of the printed circuit board. The printed circuit board includes a timing controller to control an operation of the display panel.

A rear surface of the printed circuit board makes contact with the first portion and the first portion radiates heat generated by the printed circuit board.

The second portion makes contact with the driving chip to radiate heat generated by the driving chip.

The connection portion transmits the heat, which is generated by the driving chip and provided from the second portion, to the first portion. The connection portion faces at least a portion of the one side of the display panel.

Embodiments of the inventive concept provide a display apparatus including a heat radiation sheet configured to include a first portion covering a rear surface of the display panel, a second portion connected to the first portion and covering the driving chip, and a third portion connected to the first portion and overlapped with at least a portion of the second portion.

The third portion covers a portion of the non-display area and one end of the third portion is disposed on the second portion to overlap with the second portion.

The heat radiation sheet further includes a first connection portion connecting the first portion and the second portion and a second connection portion connecting the first portion and the third portion.

The first connection portion faces at least a portion of the one side of the display panel and transmits a heat, which is generated by the driving chip and provided from the second portion, to the first portion.

The second connection portion faces the other side of the display panel, which is substantially vertical to the one side of the display panel and transmits the heat, which is generated by the driving chip and provided from the third portion, to the first portion.

According to the above, the display apparatus may effectively radiate the heat generated by the driving chip.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein:

FIGS. 2A and 2B are perspective views showing a display apparatus according to an exemplary embodiment of the present disclosure;

DETAILED DESCRIPTION

Figure 1:
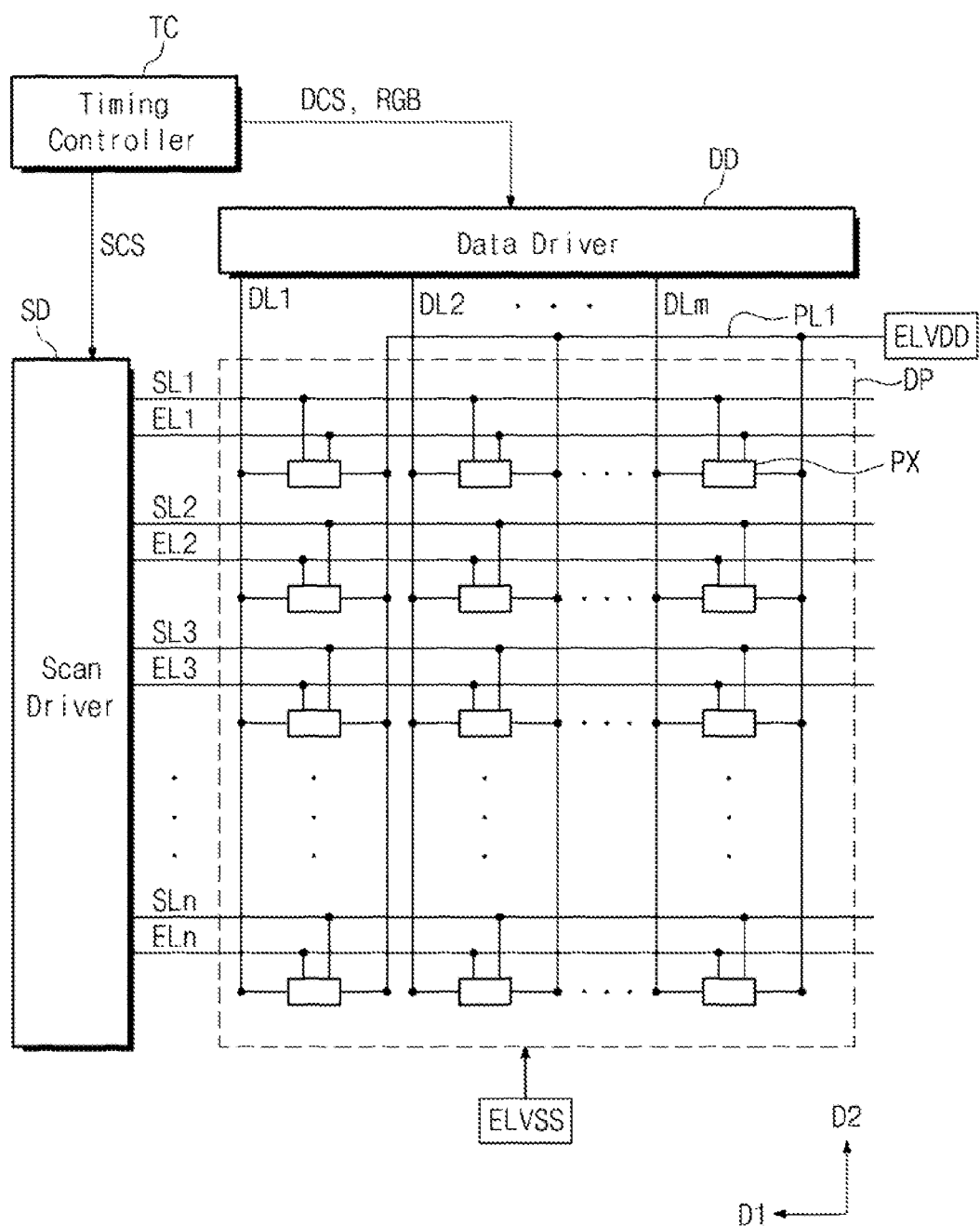
FIG. 1 is a block diagram showing a display apparatus according to an exemplary embodiment of the present disclosure.

The present invention will be described more fully hereinafter with reference to the accompanying, drawings, in which exemplary embodiments of the invention are shown. As those skilled in the art would realize, the described embodiments may be modified in various different ways, all without departing from the spirit or scope of the principles for the present invention.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the present invention will be explained in detail with reference to the accompanying drawings.

FIG. 1 is a block diagram showing a display apparatus according to an exemplary embodiment of the present disclosure. Hereinafter, an organic light emitting display apparatus will be described in detail as the display apparatus.

Referring, to FIG. 1, the display apparatus includes a timing controller TC, a scan driver SD, a data driver DD, and a display panel DP.

The timing controller TC receives input image signals (not shown) and converts a data format of the input image signals to a data format appropriate to an interface between the data driver DD and the timing controller TC to generate image data RGB. The timing controller TC outputs the image data RGB and various control signals DCS, SCS, and VCS.

The scan driver SD receives a scan control signal SCS. The scan control signal SCS includes a vertical start signal starting an operation of the scan driver SD and a clock signal determining an output timing of signals. The scan driver SD generates a plurality of scan signals and sequentially applies the scan signals to a plurality of scan lines SL1 to SLn described later. The scan driver SD generates a plurality of light emitting control signals in response to the scan control signal SCS and applies the light emitting control signals to a plurality of light emitting lines EL1 to ELn described later.

In FIG. 1, the scan signals and the light emitting control signals are output from one scan driver SD, but they should not be limited thereto or thereby. According to embodiments, the scan driver may be provided in a plural number and the scan signals and the light emitting control signals may be generated by the scan drivers. In addition, a driving circuit generating the scan signals and a driving circuit generating the light emitting control signals may be separately provided.

The data driver DD receives the data control signal DCS and the image data RGB from the timing controller TC. The data driver DD converts the image data RGB to data signals and applies the data signals to a plurality of data lines DL1 to DLm described later. The data signals are analog voltages corresponding to grayscale values of the image data RGB.

The display panel DP includes the scan lines SL1 to SLn, the light emitting lines EL1 to ELn, the data lines DL1 to DLm, and pixels PX. The scan lines SL1 to SLn extend in a first direction D1 and are arranged in a second direction D2 substantially perpendicular to the first direction D1. Each of the light emitting lines EL1 to ELn may be arranged substantially parallel to a corresponding scan line of the scan lines SL1 to SLn. The data lines DL1 to DLm are insulated from the scan lines SL1 to SLn while crossing the scan lines SL1 to SLn.

Each of the pixels PX may be connected to a corresponding scan line of the scan lines SL1 to SLn, a corresponding light emitting line of the light emitting lines EL1 to ELn, and a corresponding data line of the data lines DL1 to DLm.

Each of the pixels PX includes an organic light emitting diode (not shown) and a circuit part (not shown) to control a light emission of the organic light emitting diode. The circuit part includes thin film transistors and capacitors. The pixels PX includes red pixels emitting, a red light, green pixels emitting a green light, and blue pixels emitting a blue light. The organic light emitting diode for the red pixels, the organic light emitting diode for the green pixels, and the organic light emitting diode for the blue pixels may include organic light emitting layers having different materials from each other.

The scan lines SL1 to SLn, the light emitting lines EL1 to ELn, the data lines DL1 to DLm, and the pixels PX are formed on a base substrate (not shown) through plural photolithography processes and plural deposition positions. In addition, a sealing layer (not shown) may be further formed on the base substrate to protect the pixels PX.

The display panel DP receives a first voltage ELVDD and a second voltage ELVSS. The first voltage ELVDD may be applied to the pixels PX through a first voltage line PL1. The second voltage ELVSS may be applied to the pixels PX through electrodes (not shown) disposed on the display panel DP and a source voltage line (not shown) disposed on the display panel DP.

In the present exemplary embodiment, the pixels PX receive the second voltage ELVSS having a constant level. According to embodiments, the pixels PX may receive second voltages having different levels from each other according to the colors of the emitted light. For instance, the red pixels, the green pixels, and the blue pixels receive the second voltages ELVSS having different levels from each other.

Figure 2B:
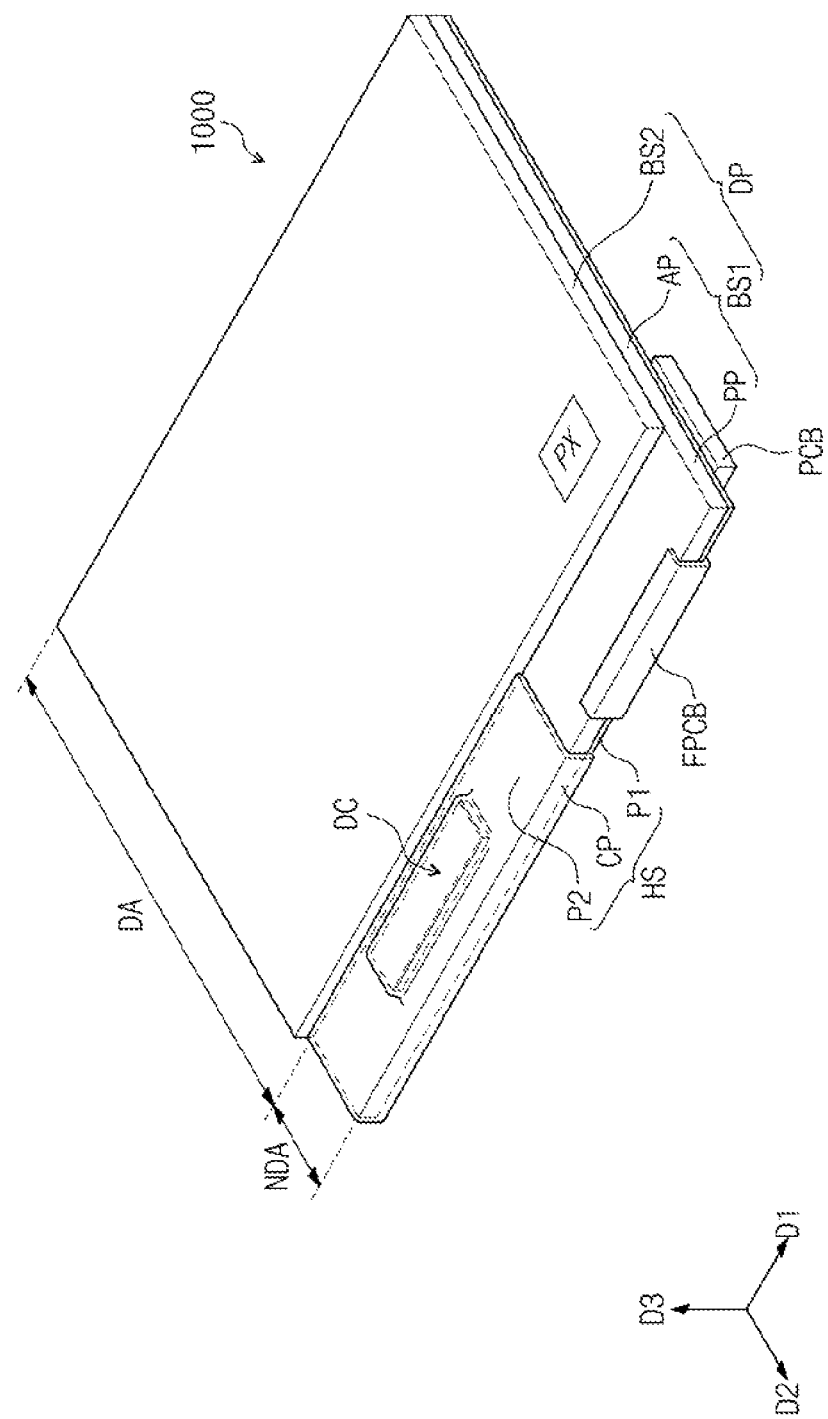

FIGS. 2A and 2B are perspective views showing a display apparatus 1000 according to an exemplary embodiment of the present disclosure.

Referring to FIGS. 2A and 2B, the display apparatus 1000 includes a display panel DP, a driving chip DC, a printed circuit board PCB, a flexible printed circuit board FPCB, and a heat radiate sheet HS.

The display panel DP includes a first base substrate BS1 and a second base substrate BS2 facing the first base substrate BS1. A light control layer (not shown) may be interposed between the first and second base substrates BS1 and BS2. In the present exemplary embodiment, the light control layer may be, but not limited to, an organic light emitting layer.

The display panel DP may have various shapes. In the present exemplary embodiment, the display panel DP has a substantially rectangular plate shape of a pair of long sides extending in the first direction D1 and a pair of short sides extending in the second direction D2. The display panel DP displays the image through an upper surface thereof, i.e., a third direction D3.

The display panel DP includes a display area DA and a non-display area NDA except for the display area DA. The pixels PX are arranged in the display area DA. The display panel DP displays the image through the pixels PX. The non-display area NDA does not display the image and various elements required to drive the pixels PX are arranged in the non-display area NDA.

The second base substrate BS2 is provided to correspond to the display area DA. The first base substrate BS1 includes a pad part PP and an array part AP. The array part AP is provided to correspond to the display area DA and faces the second base substrate BS2. The thin film transistor is provided in a plural number and the thin film transistors are arranged in the array part AP in a matrix form.

The pad part PP may be disposed at one side of the display panel DP to correspond to the non-display area NDA. An upper surface of the pad part PP may be exposed to the outside thereof without being covered by the second base substrate BS2. The second base substrate BS2 may be, but not limited to, the sealing layer.

The driving chip DC may be mounted on the pad part PP in a chip-on-glass (COG) method. As an example, the data driver DD (refer to FIG. 1) includes one driving chip DC, but the number of the driving chip DC included in the data driver DD should not be limited to one. That is, the data driver DD may include a plurality of driving chips.

The printed circuit board PCB may be electrically connected to the display panel DP. The timing controller TC, which controls the operation of the display panel DP, may be mounted on the printed circuit board PCB in a chip form. Although not shown in figures, plural control parts may be further mounted on the printed circuit board PCB to control drivers driving the pixels PX. The printed circuit board PCB extends in the first direction D1 along one long side of the display panel DP. The printed circuit board PCB may be electrically connected to the display panel DP at one side of the display panel DP.

The flexible printed circuit board FPCB may be disposed at one side of the display panel DP to electrically connect the printed circuit board PCB and the display panel DP. In more detail, one end of the flexible printed circuit board FPCB may be disposed on the pad part PP and electrically connected to the pad part PP, and the other end of the flexible printed circuit board FPCB makes contact with an upper surface of the printed circuit board PCB and may be electrically connected to the printed circuit board PCB. The flexible printed circuit board FPCB may be provided in a film form to have flexibility. Accordingly, the flexible printed circuit board FPCB may be disposed on a rear surface of the display panel DP after being bent.

The heat radiation sheet HS covers the rear surface of the display panel DP and the driving chip DC. The heat radiation sheet HS includes at least one of copper, graphite, and aluminum, but it should not be limited thereto or thereby as long as the heat radiation sheet HS includes a metal material having superior heat-conductivity.

Figure 2C:
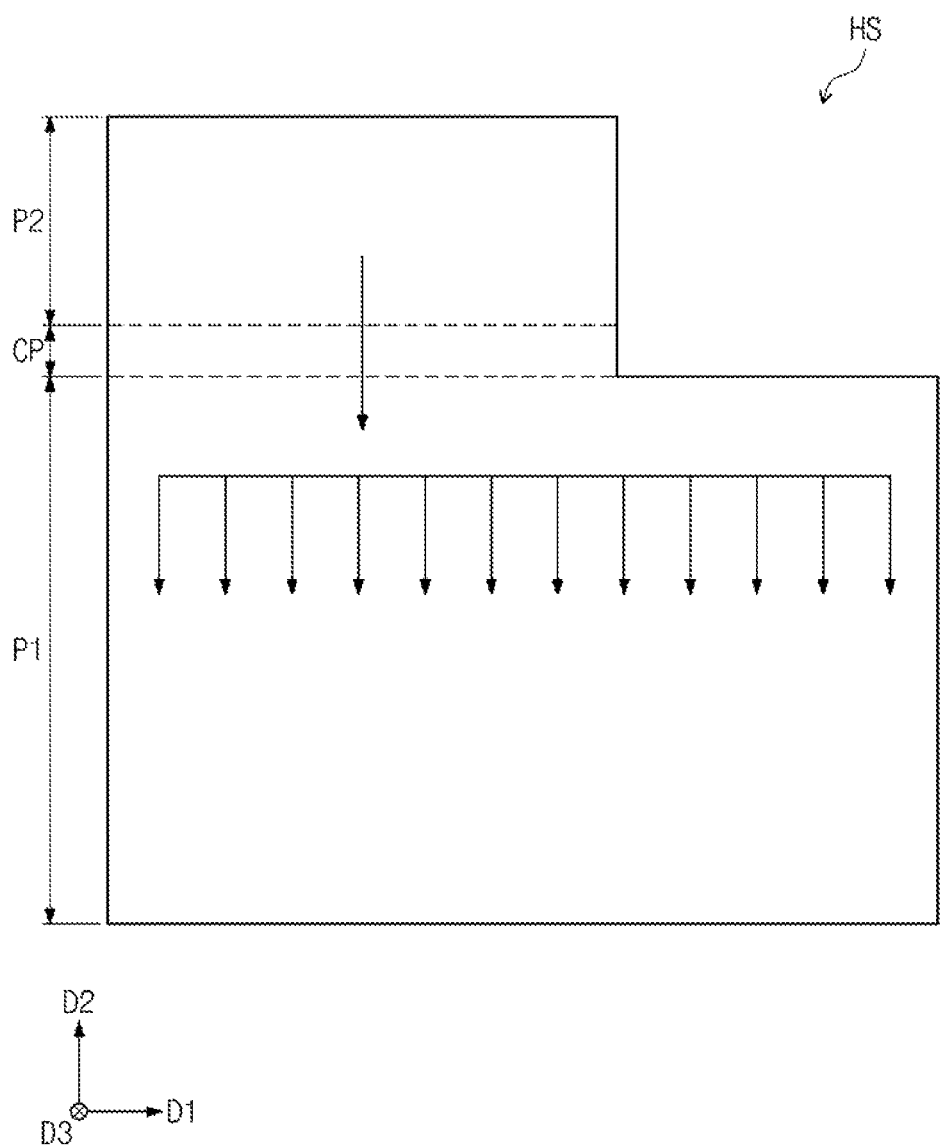
FIG. 2C is a rear-surface view showing a heat radiation sheet according to an exemplary embodiment of the present disclosure.

Hereinafter, the heat radiation sheet HS will be described in detail with reference to FIGS. 2A to 2C. FIG. 2C is a rear-surface view showing the heat radiation sheet HS according to an exemplary embodiment of the present disclosure.

Referring to FIGS. 2A to 2C, the heat radiation sheet HS includes a first portion P1 disposed on a rear surface of the first base substrate BS1, a second portion P2 covering the driving chip DC, and a connection portion CP connecting the first portion P1 and the second portion P2.

The first portion P1 has a substantially rectangular plate shape of two pairs of sides, which are substantially parallel to each other, to correspond to the shape of the display panel DP. In the present exemplary embodiment, the printed circuit board PCB may be disposed on the rear surface of the display panel DP such that a rear surface of the printed circuit board PCB makes contact with the first portion P1. Accordingly, the first portion P1 radiates heat generated in the printed circuit board PCB by the driving controllers including the timing controller TC to the outside of the display apparatus 1000.

The connection portion CP extends from one side of the first portion P1 to the second direction D2. The connection portion CP may be bent at a boundary between the connection portion CP and the first portion P1 to form a right angle with the first portion P1. The connection portion CP faces at least a portion of the one side of the display panel DP and is spaced apart from the flexible printed circuit board FPCB to be substantially parallel to the flexible printed circuit board FPCB. In the present exemplary embodiment, the connection portion CP may be disposed at the one side of the display panel DP to connect the first and second portions P1 and P2, but the position of the connection portion CP should not be limited thereto or thereby as long as the connection portion CP faces at least the portion of sides of the display panel DP and connects the first and second portions P1 and P2.

The second portion P2 extends from the connection portion CP to the second direction D2. The second portion P2 may be bent at a boundary between the connection portion CP and the second portion P2 to form a right angle with the connection portion CP. Therefore, the second portion P2 faces the first portion P1 such that the display panel DP may be disposed between the first and second portions P1 and P2.

The second portion P2 makes contact with the driving chip DC and covers the driving chip DC and a portion of the pad part PP, which may be disposed adjacent to the driving chip DC. Thus, the second portion P2 radiates heat generated by the driving chip DC to the outside of the display apparatus 1000.

In the present exemplary embodiment, the connection portion CP transmits the heat in the second portion P2 to the first portion P1.

In a conventional display apparatus, a heat radiation member disposed on the rear surface of the display panel may be spaced apart from the heat radiation member disposed on the driving chip, and thus the heat generated by the driving chip is radiated to the outside of the display apparatus only through the heat radiation member disposed on the driving chip. However, according to the present exemplary embodiment, since the heat radiation sheet HS further includes the connection portion CP so that the heat generated by the driving chip DC may be radiated not only through the second portion P2 disposed on the driving chip DC but also through the first portion P1 disposed on the rear surface of the display panel DP. Accordingly, the heat generated by the driving chip DC may be rapidly and easily radiated to the outside of the display apparatus 1000.

In addition, in the conventional display apparatus, a process of attaching the heat radiation member is performed two times to attach the heat radiation member to the driving chip and to the display panel. However, according to the present exemplary embodiment, the heat radiation sheet HS may be bent at the boundary, which is represented by a dotted line, between the first portion P1 and the connection portion CP and at the boundary, which is represented by a dotted line, between the second portion P2 and the connection portion CP while being used. Therefore, the heat radiation sheet HS may be manufactured and attached to both the driving chip DC and the display panel DP at one time.

Hereinafter, heat radiation sheets according to another exemplary embodiment will be described in detail with reference to FIGS. 3A, 3B, 4A, and 4B.

Figure 3A:
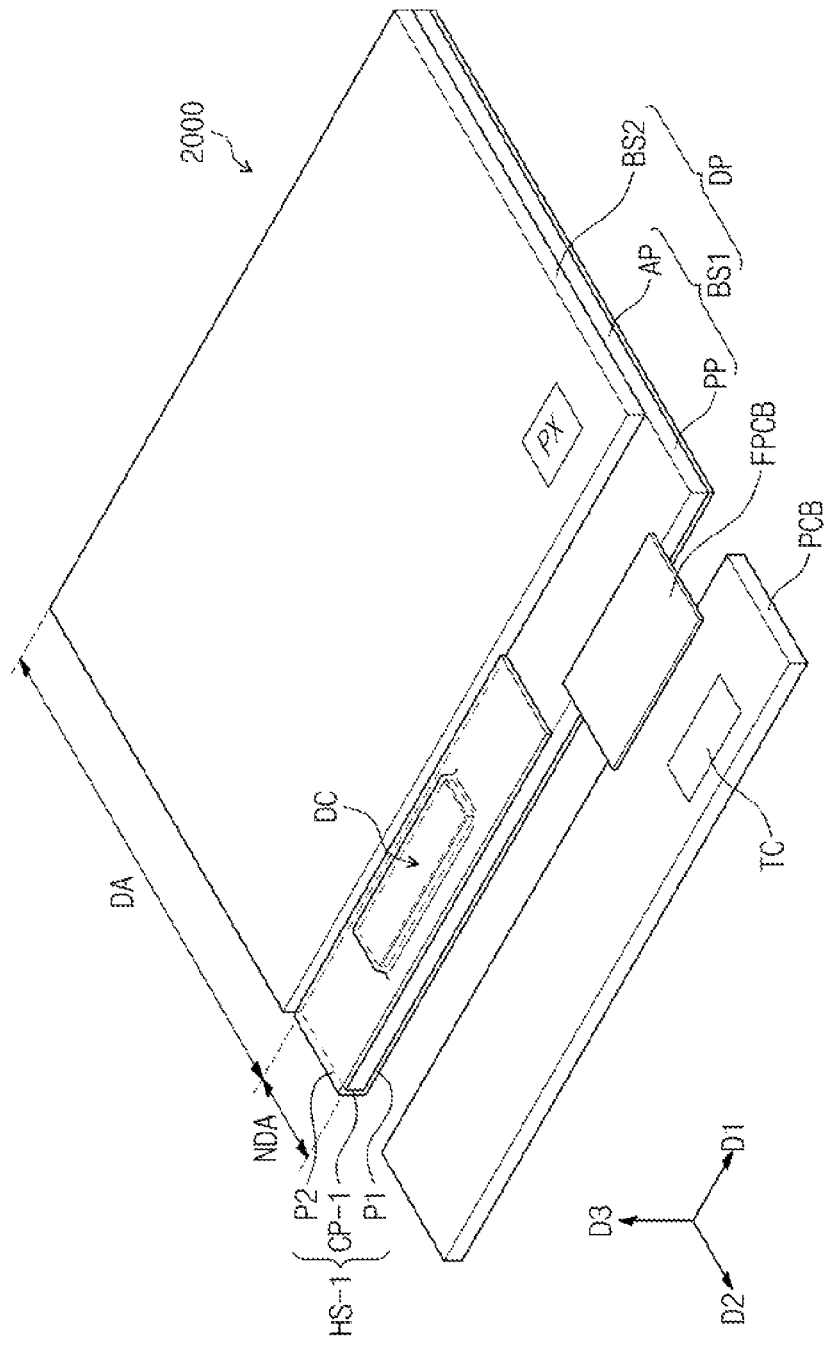
FIG. 3A is a perspective view showing a display apparatus according to another exemplary embodiment of the present disclosure.
Figure 3B:
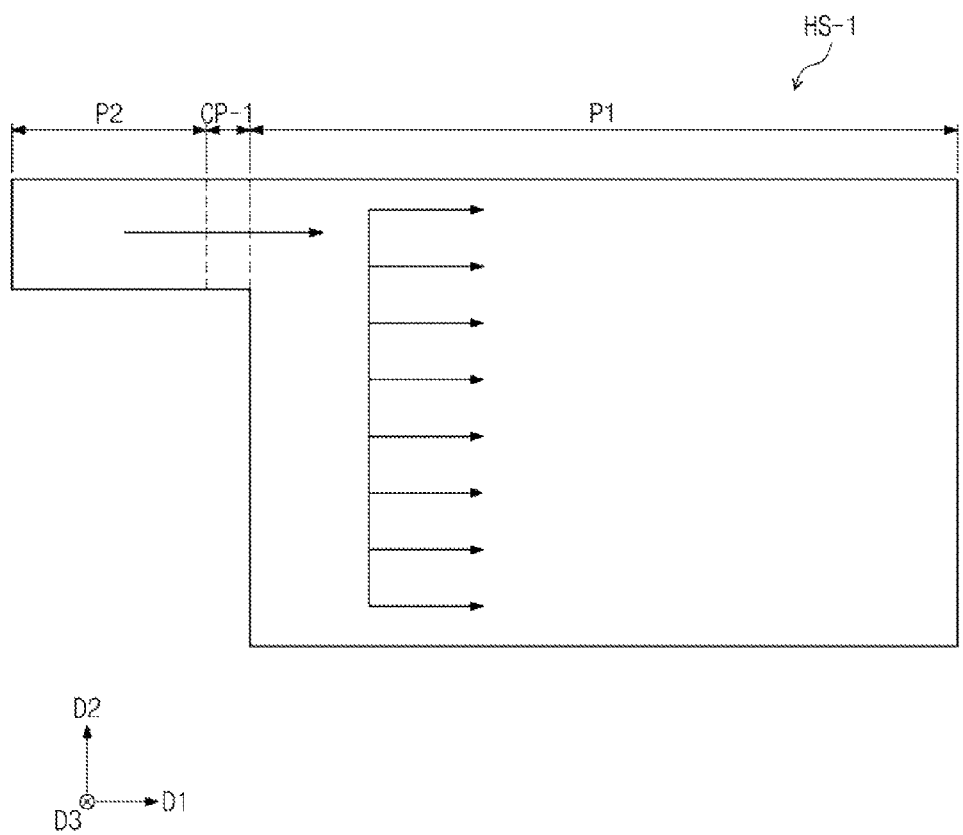
FIG. 3B is a rear-surface view showing a heat radiation sheet according to another exemplary embodiment of the present disclosure.

FIG. 3A is a perspective view showing a display apparatus 2000 according to another exemplary embodiment of the present disclosure and FIG. 3B is a rear-surface view showing a heat radiation sheet HS-1 according to another exemplary embodiment of the present disclosure.

Referring to FIGS. 3A and 3B, the heat radiation sheet HS-1 includes a first portion P1 disposed on a rear surface of the first base substrate BS1, a second portion P2 covering the driving chip DC, and a connection portion CP-1 connecting the first portion P1 and the second portion P2.

The first portion P1 has a substantially rectangular plate shape of two pairs of sides, which are substantially parallel to each other, to correspond to the shape of the display panel DP.

The connection portion CP-1 may be formed by extending at least a portion from the other side substantially vertical to one side of the first portion P1 along the first direction D1. The connection portion CP-1 may be bent at a boundary between the first portion P1 and the connection portion CP-1 to form a right angle with the first portion P1. The connection portion CP-1 may be disposed to face at least a portion of the other side of the display panel DP.

The second portion P2 extends from the connection portion CP-1 to the first direction D1. The second portion P2 may be bent at a boundary between the connection portion CP-1 and the second portion P2 to form a right angle with the connection portion CP-1. Accordingly, the second portion P2 faces the first portion P1 such that the display panel DP may be disposed between the first and second portions P1 and P2.

The second portion P2 makes contact with the driving chip DC and covers the driving chip DC and a portion of the pad part PP, which may be disposed adjacent to the driving chip DC. Thus, the second portion P2 radiates the heat generated by the driving chip DC to the outside of the display apparatus 2000.

In the present exemplary embodiment, the connection portion CP-1 transmits the heat within the second portion P2 to the first portion P1. Accordingly, the heat generated by the driving chip DC may be radiated not only through the second portion P2 disposed on the driving chip DC but also through the first portion P1 disposed on the rear surface of the display panel DP. Therefore, the heat generated in the driving chip DC may be rapidly and easily radiated to the outside of the display apparatus 1000.

Figure 4A:
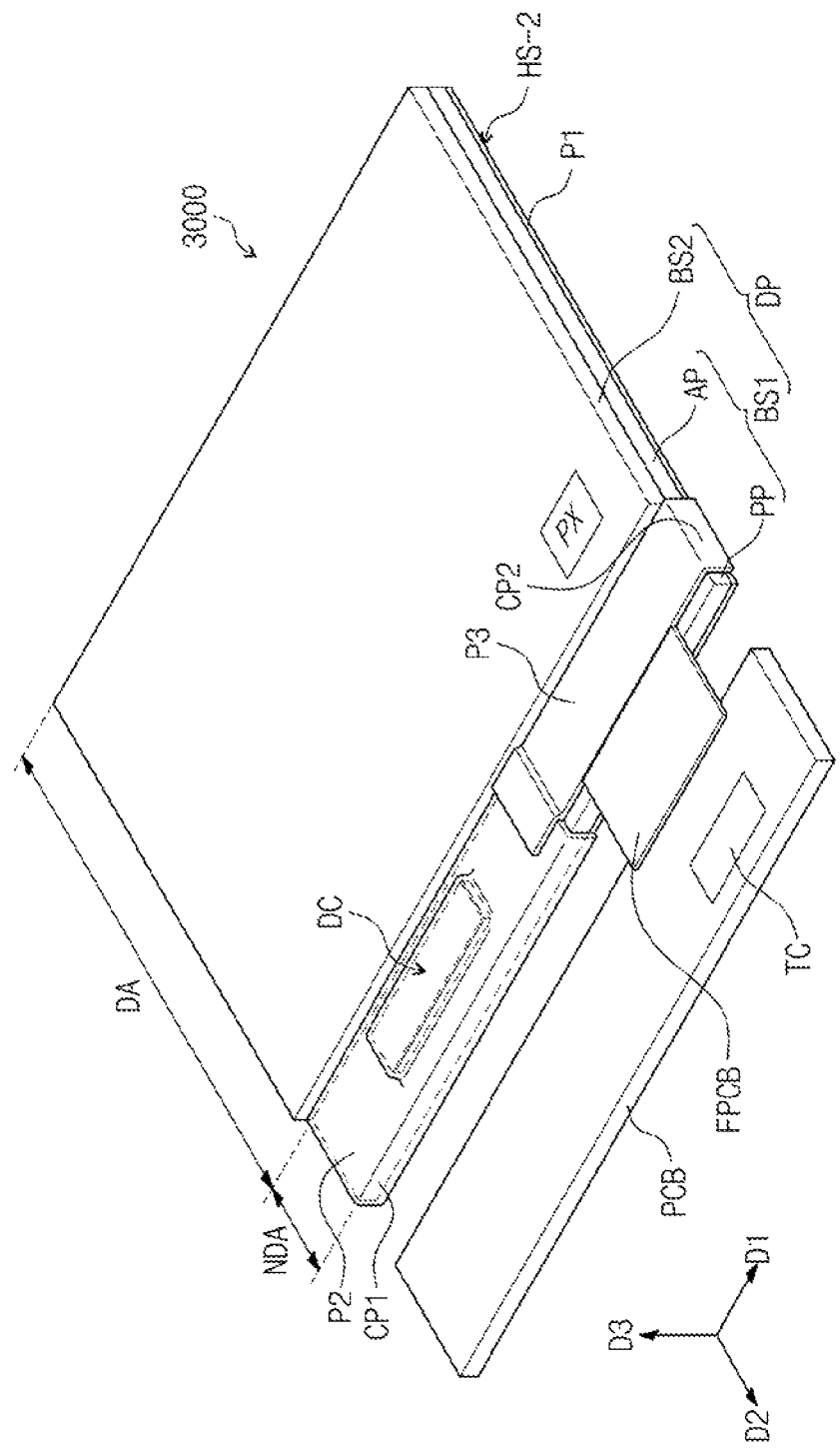
FIG. 4 is a perspective view showing a display apparatus according to another exemplary embodiment of the present disclosure.
FIG. 4B is a rear-surface view showing a heat radiation sheet according to another exemplary embodiment of the present disclosure.
Figure 4B:
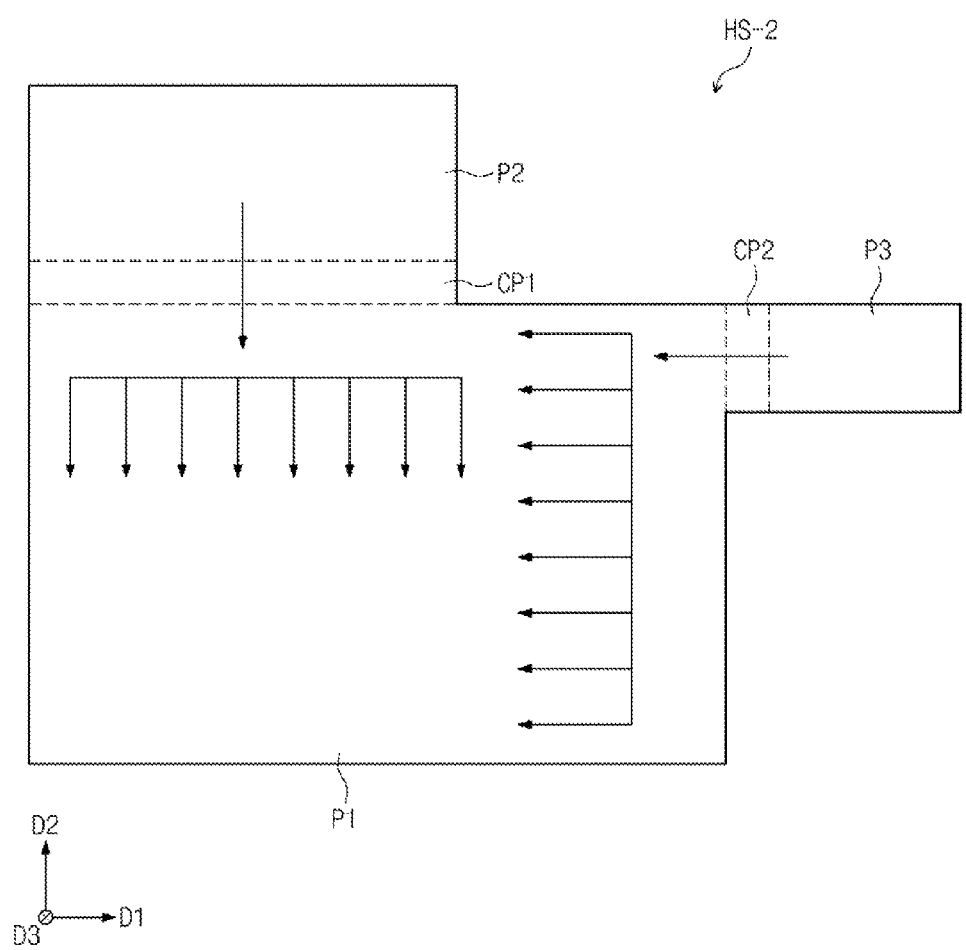

FIG. 4A is a perspective view showing a display apparatus 3000 according to another exemplary embodiment of the present disclosure and FIG. 4B is a rear-surface view showing a heat radiation sheet HS-2 according to another exemplary embodiment of the present disclosure.

Referring to FIGS. 4A and 4B, the heat radiation sheet HS-2 includes a first portion P1 disposed on a rear surface of a first base substrate BS1, a second portion P2 covering the driving chip DC, and a third portion P3 disposed on the non-display area of the display panel DP and overlapped with at least a portion of the second portion P2. In addition, the heat radiation sheet HS-2 further includes a first connection portion CP1 connecting the first and second portions P1 and P2 and a second connection portion CP2 connecting the first and third portions P1 and P3.

The first portion P1 has a substantially rectangular plate shape of two pairs of sides, which are substantially parallel to each other, to correspond to the shape of the display panel DP.

The first connection portion CP1 may be formed by extending at least a portion of one side of the first portion P1 to the second direction D2. The first connection portion CP1 may be bent at a boundary between the first portion P1 and the first connection portion CP1 to form a right angle with the first portion P1. The first connection portion CP1 faces at least a portion of one side of the display panel DP and may be spaced apart from the flexible printed circuit board FPCB to be substantially parallel to the flexible printed circuit board FPCB.

The second portion P2 extends from the first connection portion CP1 to the second direction D2. The second portion P2 may be bent at a boundary between the first connection portion CP1 and the second portion P2 to form a right angle with the first connection portion CP1. Accordingly, the second portion P2 faces the first portion P1 such that the display panel DP may be disposed between the first and second portions P1 and P2. The second portion P2 makes contact with the driving chip DC and covers a portion of the pad part PP, which may be disposed adjacent to the driving chip DC.

The second connection portion CP2 may be formed by extending at least a portion of the other side of the first portions P1, which is substantially vertical to the one side of the first portion P1. The second connection portion CP2 may be bent at a boundary between the first portion P1 and the second connection portion CP2 to form a right angle with the first portion P1. The second connection portion CP2 may be disposed to face the other side of the display panel DP.

The third portion P3 extends from the second connection portion CP2 to the first direction D1. The third portion P3 may be bent at a boundary between the second connection portion CP2 and the third portion P3 to form a right angle with the second connection portion CP2. Accordingly, the third portion P3 faces the first portion P1 such that the display panel DP may be disposed between the first and third portions P1 and P3. The third portion P3 may be disposed on the non-display area NDA between the flexible printed circuit board FPCB and the second base substrate BS2.

One end of the third portion P3 may be disposed on the second portion P2. The third portion P3 is partially overlapped with the second portion P2 above the non-display area NDA. Therefore, the third portion P3 radiates the heat generated in the driving chip DC and provided through the second portion P2 to the outside of the display apparatus 3000.

According to the present exemplary embodiment, the heat radiation sheet HS-2 includes the third portion P3, the heat generated by the driving chip DC may be easily radiated to the outside of the display apparatus 3000 through the second and third portions P2 and P3.

The first connection portion CP1 transmits the heat in the second portion P2 to the first portion P1. The second connection portion CP2 transmits the heat in the third portion P3 to the first portion P1. Thus, the heat generated by the driving chip DC may be radiated not only through the second and third portions P2 and P3 but also through the first portion P1. Accordingly, the heat generated by the driving chip DC may be rapidly and easily radiated to the outside of the display apparatus 3000.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A display apparatus, comprising:
a display panel comprising a display area configured to display an image and a non-display area located in an area of the display panel not occupied by the display area;
a driving chip disposed on the non-display area to drive the display panel; and
a heat radiation sheet comprising a first portion covering a rear surface of the display panel, a second portion covering the driving chip, and a connection portion connecting the first and the second portions,
a printed circuit board facing the display panel such that the first portion is disposed between the printed circuit board and the display panel; and
a flexible printed circuit board disposed at one side of the display panel to electrically connect the display panel and the printed circuit board.

2. The display apparatus of claim 1, wherein the printed circuit board comprises a timing controller to control an operation of the display panel.

3. The display apparatus of claim 1, wherein one end of the flexible printed circuit board makes contact with the non-display area and the other end of the flexible printed circuit board makes contact with an upper surface of the printed circuit board.

4. The display apparatus of claim 3, wherein a rear surface of the printed circuit board makes contact with the first portion and the first portion radiates heat generated by the printed circuit board.

5. The display apparatus of claim 4, wherein the second portion makes contact with the driving chip to radiate heat generated by the driving chip.

6. The display apparatus of claim 5, wherein the connection portion transmits the heat, which is generated by the driving chip and transferred to the second portion, to the first portion.

7. The display apparatus of claim 6, wherein the connection portion faces at least a portion of the one side of the display panel.

8. The display apparatus of claim 6, wherein the connection portion faces at least a portion of an other side of the display panel, which is substantially perpendicular to the one side of the display panel.

9. The display apparatus of claim 1, wherein the heat radiate radiation sheet comprises at least one of copper, graphite, and aluminum.

10. A display apparatus comprising:
a display panel comprising a display area configured to display an image and a non-display area except for the display area;
a driving chip disposed on the non-display area to drive the display panel;
a heat radiation sheet comprising a first portion covering a rear surface of the display panel, a second portion connected to the first portion and covering the driving chip, and a third portion connected to the first portion and overlapped with at least a portion of the second portion;
a printed circuit board connected to one side of the display panel and facing the display panel such that the first portion is disposed between the printed circuit board and the display panel; and
a flexible printed circuit board electrically connecting the display panel and the printed circuit board.

11. The display apparatus of claim 10, wherein the third portion covers a portion of the non-display area and one end of the third portion is disposed on the second portion.

12. The display apparatus of claim 11, wherein the heat radiation sheet further comprises:
a first connection portion connecting the first portion and the second portion; and
a second connection portion connecting the first portion and the third portion.

13. The display apparatus of claim 12, wherein the first connection portion faces at least a portion of the one side of the display panel and transmits a heat, which is generated by the driving chip and provided from the second portion, to the first portion.

14. The display apparatus of claim 13, wherein the second connection portion faces an other side of the display panel, which is substantially vertical to the one side of the display panel and transmits the heat, which is generated by the driving chip and transferred to the third portion, to the first portion.

15. A display apparatus, comprising:
a display panel comprising a display area having a plurality of pixels configured to display an image;
a non-display area of the display panel positioned adjacent to the display area and has no pixels and is unable to display any image;
a driving chip disposed on the non-display area to drive the display panel;
a heat radiation sheet having a first portion in direct contact with a portion of the display panel, a second portion connected to the first portion via a connection portion and in direct contact with the driving chip;

a printed circuit board connected to one side of the display panel and facing the display panel such that the first portion is disposed between the printed circuit board and the display panel; and a flexible printed circuit board electrically connecting the display panel and the printed circuit board.

16. The display apparatus of claim 15, wherein heat generated by the driving chip radiates through both the first portion and the second portion of the heat radiation sheet.

17. The display apparatus of claim 16, wherein the connection portion faces at least a portion of one side of the display panel and transmits heat, which is generated by the driving chip and transferred to the second portion, to the first portion.

18. The display apparatus of claim 17, wherein the connection portion has two 90 degree bends therein between the first portion and the second portion.

* * * * *